United States Patent [19]
Huang et al.

[11] Patent Number: 5,950,096
[45] Date of Patent: Sep. 7, 1999

[54] PROCESS FOR IMPROVING DEVICE YIELD IN INTEGRATED CIRCUIT FABRICATION

[75] Inventors: Robert Y.S. Huang; David Kou-Fong Hwang, both of Ocoee; Stephen Carl Kuehne, Orlando; Jean Ling Lee, Orlando; Jane Qian Liu, Orlando; Yi Ma, Orlando; Minseok Oh, Orlando, all of Fla.

[73] Assignee: Lucent Technologies Inc., Murray Hill, N.J.

[21] Appl. No.: 08/935,362

[22] Filed: Sep. 22, 1997

[51] Int. Cl.⁶ ......................................... H01L 21/76
[52] U.S. Cl. ..................... 438/443; 438/289; 438/449; 438/530
[58] Field of Search ............................ 438/287, 297, 438/443, 449, 530

[56] References Cited

U.S. PATENT DOCUMENTS

| | | | |
|---|---|---|---|
| 5,376,577 | 12/1994 | Roberts et al. | 438/526 |
| 5,650,350 | 7/1997 | Dennison et al. | 438/211 |
| 5,686,346 | 11/1997 | Duane | 438/443 |
| 5,744,391 | 4/1998 | Chen | 438/264 |
| 5,861,334 | 1/1999 | Rho | 438/289 |

*Primary Examiner*—Trung Dang
*Attorney, Agent, or Firm*—Joel F. Spivak

[57] ABSTRACT

In the fabrication of an integrated circuit, undesirable bird's beak pull back due to damage caused during ion implantation is alleviated by means of rapid thermal annealing step prior to chemical etching.

18 Claims, 1 Drawing Sheet

US 5,950,096

PROCESS FOR IMPROVING DEVICE YIELD IN INTEGRATED CIRCUIT FABRICATION

TECHNICAL FIELD

This invention relates to methods for the fabrication of integrated circuits.

BACKGROUND OF THE INVENTION

Typical submicron integrated circuit manufacturing processes include, for example, the definition of isolation oxides, sometimes called field oxides 13 (FIG. 1) upon a substrate 11. The field oxides 13 define a comparatively flat region 15 of the substrate which lies between the field oxides 13. This flat region 15 is often termed the "moat". In the initial stages of integrated circuit fabrication, e.g. CMOS fabrication, the moat is covered with a sacrificial grown oxide 17.

After formation of the field oxide 13 and sacrificial oxide 17, one or more ion implantation steps is performed, for example, to define either a p-tub or an n-tub depending upon the species of implanted ions 19, or to adjust the threshold voltage of subsequently formed devices, e.g. transistors. Illustrative implantation species are arsenic, phosphorus, boron and boron difluoride.

The ion implantation step tends to change the stoichiometry and density of the upper portion 21 of the field oxide 13 causing this upper portion 21 of the field oxide 13 to etch more quickly when exposed to a wet etch solution, e.g. HF, than oxides which have not been influenced or damaged by ion implantation.

After dopant species 19 has been implanted into the substrate, a wet etch is performed to remove the sacrificial oxide 17 thereby exposing the ion implanted substrate 11 for subsequent processing, such as the formation of a gate oxide layer (not shown). At the same time that the sacrificial oxide is being removed by the wet etch, the etch solution also attacks the ion implant-altered upper surface 21 of the field oxide 13, thereby etching this surface downward to a location approximately indicated by reference line 23.

The exposure of the silicon substrate originally under the field oxide 13 is sometimes called "bird's beak pull back". This pull back is undesirable in that it reduces the vertical height of the field oxide 13 and often exposes a portion 25 (FIG. 2) of the substrate 11 which originally lay under the field oxide 13 and which has a different dopant concentration than the adjacent moat area 15. The height reduction of the field oxide 13 is particularly undesirable for submicron devices which use comparatively thin field oxides. Such thinning of the field oxide adversely affects the effectiveness of the field oxide in inhibiting parasitic transistor action and reduces the ability of the field oxide to block source-drain ion implantation. The above mentioned problems adversely affect device yield as well as device performance. The enhanced field oxide etch rate also enhances bird's beak pullback.

Those concerned with integrated circuit technology fabrication have sought more reliable methods of fabrication including methods to substantially reduce bird's beak pull back.

SUMMARY OF THE INVENTION

A method of integrated circuit device fabrication comprises the steps of forming a field oxide to thereby define moats upon a substrate, forming a sacrificial layer upon said moat, ion implanting dopant species through said sacrificial layer, rapidly thermally annealing the device, and removing the sacrificial layer subsequent to annealing.

DETAILED DESCRIPTION

Figure 1:
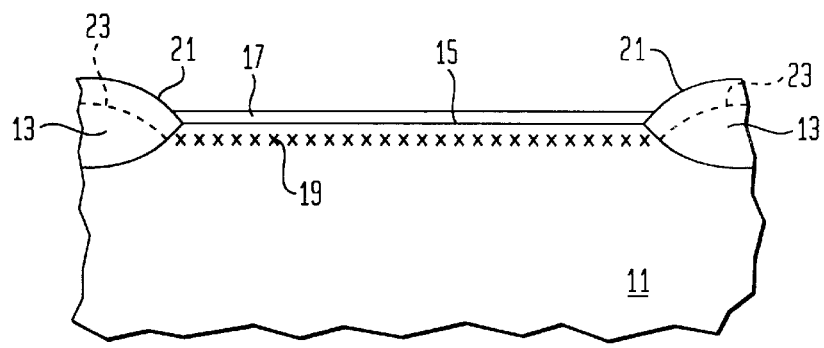
FIGS. 1 and 2 are cross sectional views of a partially fabricated integrated circuit (IC) showing the IC before (FIG. 1) and after (FIG. 2) etching of the sacrificial oxide and are useful in understanding the invention and illustrative of the problem of bird's beak pull back.
Figure 2:
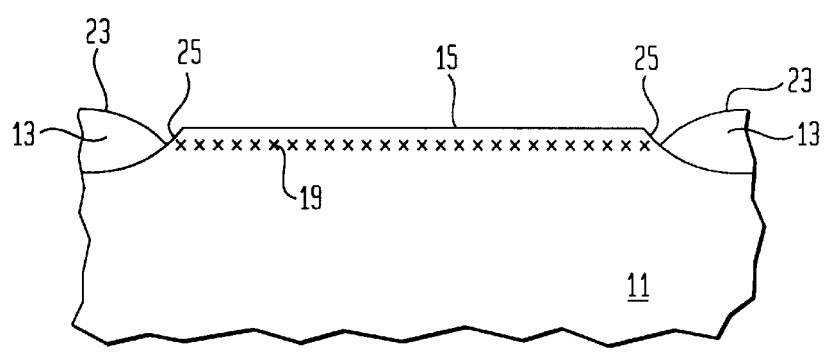
Figure 3:
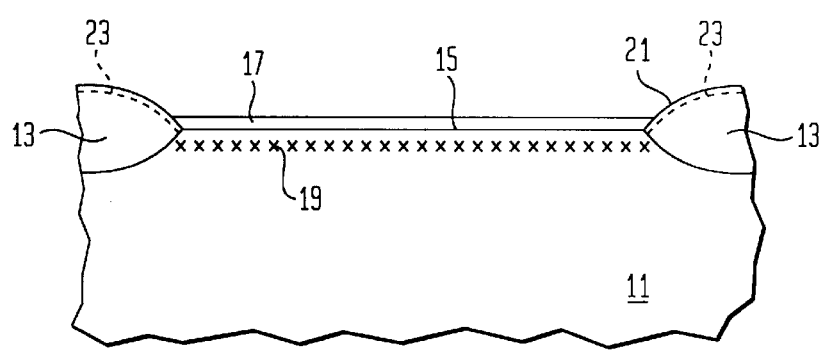
FIGS. 3 and 4 are cross sectional views of a partially fabricated IC showing the IC before (FIG. 3) and after (FIG. 4) etching of the sacrificial oxide and are useful in understanding the invention and illustrative of the substantial elimination of the problem of bird's beak pull back when the integrated circuit device is processed in accordance with the present invention.
Figure 4:
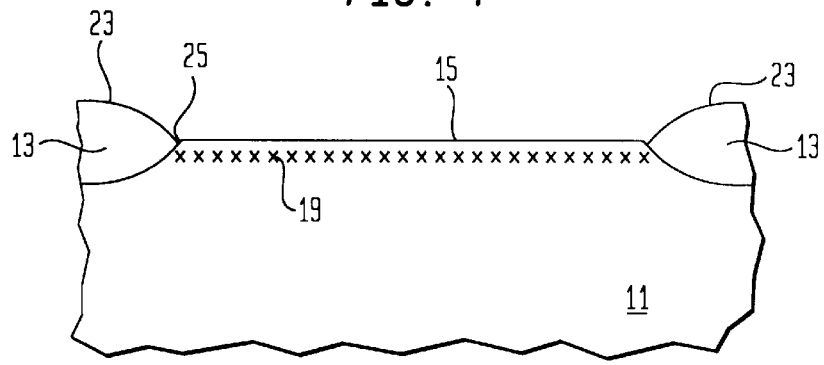

The present invention will be described with reference to FIGS. 3 and 4. The reference numerals described with regard to FIGS. 1 and 2 apply to similar parts of the integrated circuit device shown in FIGS. 3 and 4. Referring to FIGS. 3 and 4, reference numeral 11 denotes a substrate which may, for example, be silicon, epitaxial silicon, or doped silicon. Reference numeral 13 denotes a field oxide or other isolation oxide which may be formed by a variety of methods known to those skilled in the art, including the popular LOCOS ("local oxidation of silicon") or poly-buffered LOCOS process. Reference numeral 17 denotes a grown oxide, often termed "a sacrificial oxide". Illustratively, the thickness of oxide 17 is typically 150Å±50Å but may be more or less than this thickness. One or more ion implantation steps are performed by methods also well known to those skilled in the art. Illustratively, dopants such as arsenic, boron, phosphorus and boron difluoride are employed for ion implantation. Some of the implanted dopant species are denoted by reference numeral 19. Other species implanted to possible greater depth are not shown for reasons of clarity. Illustratively, the ion implantation step may be performed to form an n-tub or a p-tub, or may be performed to adjust the threshold voltage of the yet-to-be completed devices. During ion implantation, the surface 21 of the field oxide 13 is undesirably altered causing the etch characteristics of the surface region 21 of the field oxide 13 to change such that the etch rate is significantly increased. If etching of the sacrificial oxide layer 17 were to be carried out at this stage, then as shown in FIG. 2, etching can result in significant and undesirable height reduction of the field oxide 13 and may also cause exposure of a portion of the substrate 25 previously protected by the field oxide 13, i.e. bird's beak pull back.

In accordance with the present invention, however, prior to etching of the sacrificial oxide layer 17, the device is rapidly thermally annealed. This thermal annealing tends to eliminate or retard the effects of the damage incurred to the surface of the field oxide 13 during ion implantation, thereby slowing the etch rate of the surface 21 of the field oxide 13. This results in significantly less removal of field oxide material during the etch step and hence better maintains the height of the field oxide thereby eliminating or substantially reducing bird beak pull back and unwanted exposure of substrate material adjacent the moat 15.

Illustratively, the rapid thermal annealing is preferably achieved by quickly ramping up the temperature of the device, for example, at a rate of from about 25° C./sec. to 150° C./sec. (preferably 45° C./sec. to 55° C./sec.) to a temperature of from about 700° C. to 1100° C. (preferably 800° C. to 1000° C. and most preferably about 900° C.) for about from 5 to 60 seconds (preferably about 30 seconds) in an inert atmosphere, an oxygen atmosphere or preferably in a mixture of an inert atmosphere, such as nitrogen or other non-reactive gas, mixed with from 2% to up to 100% oxygen by volume (preferably comprising a mixture containing 10 vol. % oxygen). While the invention is not limited to the specific ranges of time, temperature, rate and percentages given above, the ranges set forth are preferred for a variety of reasons. For example, annealing temperatures above about 1,100° C. may lead to unwanted diffusion of implanted ions, especially if one combined this higher temperature with a long annealing time. Too low a temperature, e.g. below about 700° C. may lead to too long a required annealing time to be practical to achieve the desired results or may be ineffectual. Similarly, oxygen concentrations greater than about 10% tend to cause increased growth of the sacrificial oxide when combined with high annealing temperatures and/or long annealing times. The optimum time of annealing will depend upon the other parameters as well as the thickness of the sacrificial oxide to be removed and the extent and depth of damage of the field oxide during ion implantation. Preferably, the annealing parameters employed should not result in the growth of a new oxide layer or substantial thickening of the sacrificial oxide 17.

Subsequent to annealing, the sacrificial oxide layer 17 is removed, for example, by an HF wet etch process well known to those skilled in the art. The bird's beak pull back problem mentioned previously is alleviated because the damage done to field oxide 13 during implantation has been reduced or reversed by the annealing step. Subsequent processing may include the formation, for example, of gates in moat 15, definition of source and drain regions, dielectric deposition, window opening, contact metallization, etc. as is well known to those skilled in the art. Greater details of these and other commonly employed integrated circuit processing techniques can be found with reference to VLSI Technology, 2nd Edition, a text edited by S. M. Sze and published by McGraw-Hill, Inc., 1988, which text is incorporated herein by reference.

The invention claimed is:

1. A method for the fabrication of integrated circuit devices comprising:

forming a plurality of spaced field oxide regions to thereby define moats upon a substrate;

forming a first layer upon said moat;

performing an ion implant through said first layer;

rapidly thermally annealing the device; and removing the first layer subsequent to annealing.

2. The method recited in claim 1 wherein the substrate comprises silicon.

3. The method recited in claim 2 wherein the first layer is a sacrificial oxide layer.

4. The method recited in claim 3 wherein said first layer is removed by means of a wet etch solution.

5. The method recited in claim 4 wherein the wet etch solution comprises hydrofluoric acid.

6. The method recited in claim 1 wherein no substantial thickening of, or growth on, the first layer occurs during annealing.

7. The method recited in claim 1 wherein the device is annealed at a temperature of about 700° C. to 1100° C. for about from 5 to 60 seconds in an atmosphere comprising an inert atmosphere, oxygen or a mixture of an inert gas and oxygen.

8. The method recited in claim 7 wherein the oxygen is from about 2% to 100% of the gas atmosphere.

9. The method recited in claim 7 wherein the oxygen content of the gas mixture is about 10% by volume.

10. The method recited in claim 7 wherein the temperature of the device is ramped up to the annealing temperature at a rate of from about 25 to 150° C./sec.

11. The method recited in claim 10 wherein the device is annealed at a temperature of from about 800° C. to 1000° C.

12. The method recited in claim 11 wherein the device is annealed at a temperature of about 900° C.

13. The method recited in claim 7 wherein the temperature of the device is ramped up to the annealing temperature at a rate of about 50° C.±5° C. per second.

14. A method for the fabrication of an integrated circuit device comprising:

forming a plurality of spaced field oxides to thereby define moats therebetween upon a silicon substrate;

forming a sacrificial oxide layer upon said moats;

performing an ion implantation through said sacrificial oxide layer into said moat;

rapidly thermally annealing said device at a temperature of about 900° C.±100° C. for about 5 to 60 seconds in a mixture of an inert gas and oxygen;

etching away said sacrificial oxide with a wet HF etchant subsequent to annealing.

15. The method recited in claim 14 wherein no substantial thickening of, or growth on, the sacrificial oxide layer occurs during annealing.

16. The method recited in claim 14 wherein the oxygen content of the gas mixture is from about 2% up to about 100%.

17. The method recited in claim 14 wherein the oxygen content of the gas mixture is about 10%.

18. The method recited in claim 14 wherein the temperature of the device is ramped up to the annealing temperature at a rate of about 50° C.±5° C. per second.

* * * * *